United States Patent
Butzmann

(10) Patent No.: US 9,620,967 B2
(45) Date of Patent: Apr. 11, 2017

(54) AUTONOMOUS BATTERY BALANCING

(75) Inventor: Stefan Butzmann, Beilstein (DE)

(73) Assignees: Robert Bosch GmbH, Stuttgart (DE); Samsung SDI Co., Ltd., Yongin-si, Gyonggi-do (KR)

( * ) Notice: Subject to any disclaimer, the term of this patent is extended or adjusted under 35 U.S.C. 154(b) by 840 days.

(21) Appl. No.: 13/885,908

(22) PCT Filed: Sep. 27, 2011

(86) PCT No.: PCT/EP2011/066731
§ 371 (c)(1),
(2), (4) Date: Dec. 5, 2013

(87) PCT Pub. No.: WO2012/065779
PCT Pub. Date: May 24, 2012

(65) Prior Publication Data
US 2015/0145443 A1 May 28, 2015

(30) Foreign Application Priority Data
Nov. 16, 2010 (DE) .................. 10 2010 043 950

(51) Int. Cl.
H02J 7/16 (2006.01)
H02J 7/00 (2006.01)
(Continued)

(52) U.S. Cl.
CPC ......... *H02J 7/0016* (2013.01); *B60L 11/1851* (2013.01); *B60L 11/1866* (2013.01);
(Continued)

(58) Field of Classification Search
CPC ... H02J 7/0016; H02J 7/0021; B60L 11/1851; B60L 11/1866; G01R 31/3606; G01R 31/3658; Y02T 10/7055
(Continued)

(56) References Cited

U.S. PATENT DOCUMENTS 5,677,613 A    10/1997   Perelle
6,054,841 A    4/2000   Sudo et al.
(Continued)

FOREIGN PATENT DOCUMENTS

CN    2033781 U    3/1989
CN    1194229 C    3/2005
(Continued)

OTHER PUBLICATIONS

International Search Report corresponding to PCT Application No. PCT/EP2011/066731, mailed Mar. 5, 2012 (German and English language document) (5 pages).

*Primary Examiner* — Robert Grant
*Assistant Examiner* — Harry O'Neill-Becerril
(74) *Attorney, Agent, or Firm* — Maginot, Moore & Beck LLP

(57) ABSTRACT

A device is introduced for cell-balancing a plurality of battery cells connected in series. The device includes a measuring device which is connectable to each of the battery cells and which is configured to generate a current which is proportional to a minimum cell voltage of all the cell voltages of the battery cells and to output the current to resistors which are connected in series. The device also contains a multiplicity of comparators which compare a cell voltage of an assigned battery cell to the minimum cell voltage which is replicated by the current which is proportional to the minimum cell voltage and the resistors. The comparators are configured to output a control signal, which is dependent on a result of the comparison, to an assigned discharging unit which allows a discharge current to flow from the respective battery cell as a function of the control signal.

5 Claims, 4 Drawing Sheets

(51) Int. Cl.
 *B60L 11/18* (2006.01)
 *G01R 31/36* (2006.01)
(52) U.S. Cl.
 CPC ........ *G01R 31/3606* (2013.01); *H02J 7/0021* (2013.01); *G01R 31/3658* (2013.01); *Y02T 10/7055* (2013.01)
(58) Field of Classification Search
 USPC .......................................................... 320/119
 See application file for complete search history.

(56) References Cited

U.S. PATENT DOCUMENTS

| | | | |
|---|---|---|---|
| 6,081,095 A | 6/2000 | Tamura et al. | |
| 6,121,752 A | 9/2000 | Kitahara et al. | |
| 2005/0269989 A1* | 12/2005 | Geren | H02J 7/0016 320/119 |
| 2006/0001403 A1 | 1/2006 | Yudahira | |
| 2006/0082343 A1* | 4/2006 | Sobue | H02J 7/0016 320/119 |
| 2007/0222422 A1* | 9/2007 | Inoue | G05F 1/573 323/274 |

FOREIGN PATENT DOCUMENTS

| | | |
|---|---|---|
| CN | 201369596 Y | 12/2009 |
| JP | 10-253725 A | 9/1998 |
| WO | 01/22107 A1 | 3/2001 |

* cited by examiner

AUTONOMOUS BATTERY BALANCING

This application is a 35 U.S.C. §371 National Stage Application of PCT/EP2011/066731, filed on Sep. 27, 2011, which claims the benefit of priority to Serial No. DE 10 2010 043 950.9, filed on Nov. 16, 2010 in Germany, the disclosures of which are incorporated herein by reference in their entirety.

The present disclosure relates to an apparatus for the balancing (charge equalization) of the battery cells of a battery comprising a plurality of battery cells connected in series, wherein according to the disclosure control by a microcontroller is not necessary, that is to say that the apparatus can operate autonomously.

BACKGROUND

It is becoming apparent that in the future battery systems will increasingly be used both in stationary applications and in vehicles such as hybrid and electric vehicles. In order to be able to fulfill the requirements provided for a respective application in respect of voltage and available power, a high number of battery cells are connected in series. Owing to the series connection, the failure of one battery cell can lead to the failure of the battery and this in turn can lead to a failure of the overall system, for which reason, in particular for safety-relevant applications, stringent requirements are made of the reliability of the battery. In order to be able to detect the state of the battery and of the individual battery cells as accurately as possible and thus identify an imminent failure of a battery cell in good time, alongside other parameters of the battery or battery cells in particular the voltages, too, of the battery cells are measured regularly. The prior art discloses numerous methods which carry out so-called cell balancing, that is to say seek to match the charge states of the different battery cells of a battery to one another, which has a positive effect on the lifetime of the battery. For this purpose, the battery is equipped with units which determine the cell voltages of the individual battery cells and optionally further measurement variables such as battery temperature and battery current and communicate them to a central control unit (for example a microcontroller). The control unit calculates a respective charge state from the communicated measurement data for each battery cell and generates the control signals necessary for carrying out cell balancing, which control signals bring about the charge equalization among the battery cells in the battery by, for example, battery cells that have a higher charge state being partly discharged. In this case, the control unit is arranged outside the battery in order to be able to perform further tasks. However, this entails the disadvantage that relatively complex safety measures such as isolators arranged in the data path have to be implemented in order to prevent, in the case of a fault, a short circuit between the high battery voltage (often hundreds of volts in the case of battery-operated drive systems) and the parts which are arranged in the low-voltage power supply system and can be touched externally, such as the control unit.

SUMMARY

The disclosure introduces an apparatus for the cell balancing of the battery cells of a battery comprising a plurality of battery cells connected in series. The apparatus comprises a measuring apparatus, which is connected or can be connected to each of the battery cells and which is designed to generate a current proportional to a minimum cell voltage of all the cell voltages of the battery cells and to output said current to a plurality of resistors connected in series. In this case, a number n of the resistors is equal to a number of battery cells which are connected or can be connected to the measuring apparatus. The apparatus additionally has a number (n−1) of potential replication devices, which are in each case connected between two adjacent resistors of the plurality of resistors and are designed to replicate a potential at a first pole of an assigned battery cell and to output it to a first of the respective two adjacent resistors. The apparatus additionally contains a number n of comparators, which in each case have a first input connected to a second pole of an assigned battery cell, a second input connected to a second of the respective adjacent resistors, and an output connected to a control electrode of a respective discharging unit. The comparators are designed to compare a first voltage present at the first input with a second voltage present at the second input and to output a control signal dependent on a result of the comparison. In this case, the discharging units are connected in parallel with a respective battery cell and are designed to allow a discharge current to flow from the respective battery cell depending on the control signal.

The disclosure has the advantage that cell balancing of the battery cells of the battery can be performed fully autonomously, that is to say that a control by a control unit arranged outside the battery can be omitted. For this purpose, merely a simple electronic circuit is necessary, which determines a minimum cell voltage of all the battery cells and compares the cell voltages of the individual battery cells with said minimum cell voltage. If the cell voltage of a given battery cell is higher than the minimum cell voltage, the battery cell is discharged by the assigned discharging unit.

According to the disclosure, complex measures for isolating the battery from the low-voltage power supply system in which such a control unit is usually arranged can be obviated in this way.

Preferably, the discharging units contain a switchable current source, which is designed to allow the discharge current to flow in response to a first logic level of the control signal and to prevent a current flow in response to a second logic level of the control signal. In one simple and therefore preferred embodiment, the switchable current source can contain a current limiting resistor and a switch, wherein a control electrode of the switch forms the control electrode of the discharging unit. In this embodiment, moreover, the discharge current becomes proportional to the cell voltage of the battery cell to be discharged, such that, advantageously, battery cells that are already relatively highly discharged are discharged to a lesser extent than battery cells having higher charge states in the context of the cell balancing.

The comparators are preferably designed to output the control signal with the first logic level if a cell voltage of the assigned battery cell is greater than the minimum cell voltage of all the cell voltages of the battery cells plus an offset voltage. Dynamic effects such as momentarily fluctuating cell voltages or noise which can lead to a disturbing continuous fast changeover of the discharging units can be suppressed as a result.

The potential replication devices can each comprise a pnp transistor and an npn transistor, wherein a base of the pnp transistor is connected to the first pole of the assigned battery cell, an emitter of the pnp transistor is connected to a base of the npn transistor, and an emitter of the npn transistor is connected to the first of the respective two adjacent resistors. This embodiment of the potential replication devices has the advantage that the potential at the base of the pnp transistor is replicated very precisely at the emitter of the npn transistor because the base-emitter voltages of the two transistors mutually cancel one another out. In this case, it is additionally advantageous that the thermal behavior of the base-emitter voltages of the two transistors is identical or at least very similar over wide temperature ranges, such that the mutual compensation of the base-emitter voltages functions temperature-independently.

The plurality of series-connected resistors each have a resistance value corresponding to a quotient of the minimum cell voltage of all the cell voltages of the battery cells and the current proportional to the minimum cell voltage of all the cell voltages of the battery cells.

The measuring apparatus can have a number n of differential amplifiers, wherein each of the differential amplifiers comprises a pair of transistors, the emitter or source of which are connected to one another and to an input for a current source and the control electrodes of which are connected to a respective one of two signal inputs of the differential amplifier. In this case, preferably, the input for the current source of a first one of the differential amplifiers is connected to a current source and the collector or the drain of one of the transistors of the pair of transistors is connected to the input for the current source of a further one of the differential amplifiers, thus resulting in a cascading of the differential amplifiers. This cascading of differential amplifiers has the advantage that each of the differential amplifiers acts as a current source for the differential amplifier arranged thereabove. On account of the functioning of a differential amplifier having two branches, however, the current flows in each case only in one branch of the differential amplifier depending on the voltages present at the inputs of the differential amplifier. Therefore, a current can only flow through all the differential amplifiers and thus through the measuring apparatus if the voltage at both inputs is identical or the voltage across the respective battery cell is greater than the voltage across the resistor connected to the other input of the respective differential amplifier. This results in a regulating system that sets the current at the output of the measuring apparatus precisely such that it becomes proportional to the minimum cell voltage of all the cell voltages.

A second aspect of the disclosure introduces a battery comprising a plurality of battery cells, preferably lithium-ion battery cells, connected in series and an apparatus according to the first aspect of the disclosure, said apparatus being connected to the battery cells.

A third aspect of the disclosure relates to a motor vehicle comprising an electric drive motor for driving the motor vehicle and a battery according to the preceding aspect of the disclosure, said battery being connected to the electric drive motor.

BRIEF DESCRIPTION OF THE DRAWINGS

Exemplary embodiments of the disclosure will be explained in greater detail with reference to the drawings and the following description, wherein identical reference signs designate identical components or components that are functionally of the same type. In the figures.

DETAILED DESCRIPTION

Figure 1:
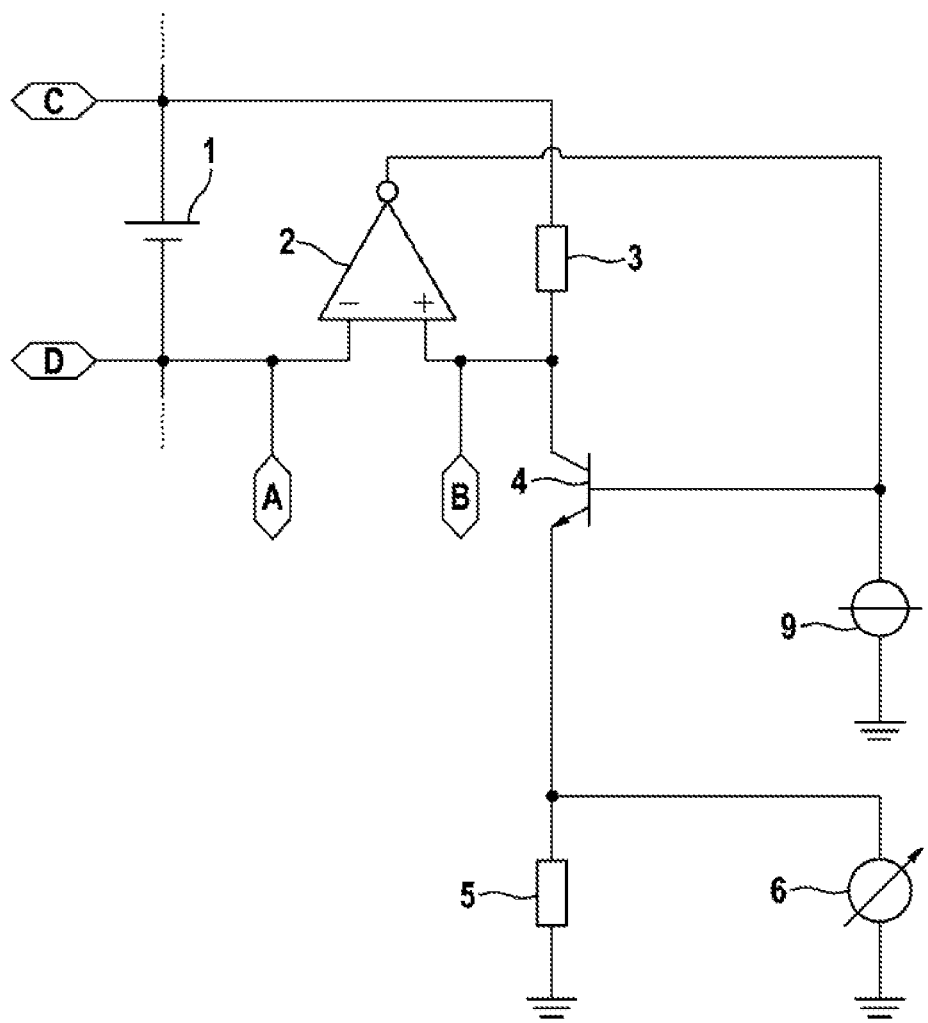
FIG. 1 shows a first exemplary embodiment of a measuring apparatus for use in the context of the disclosure.
Figure 2:
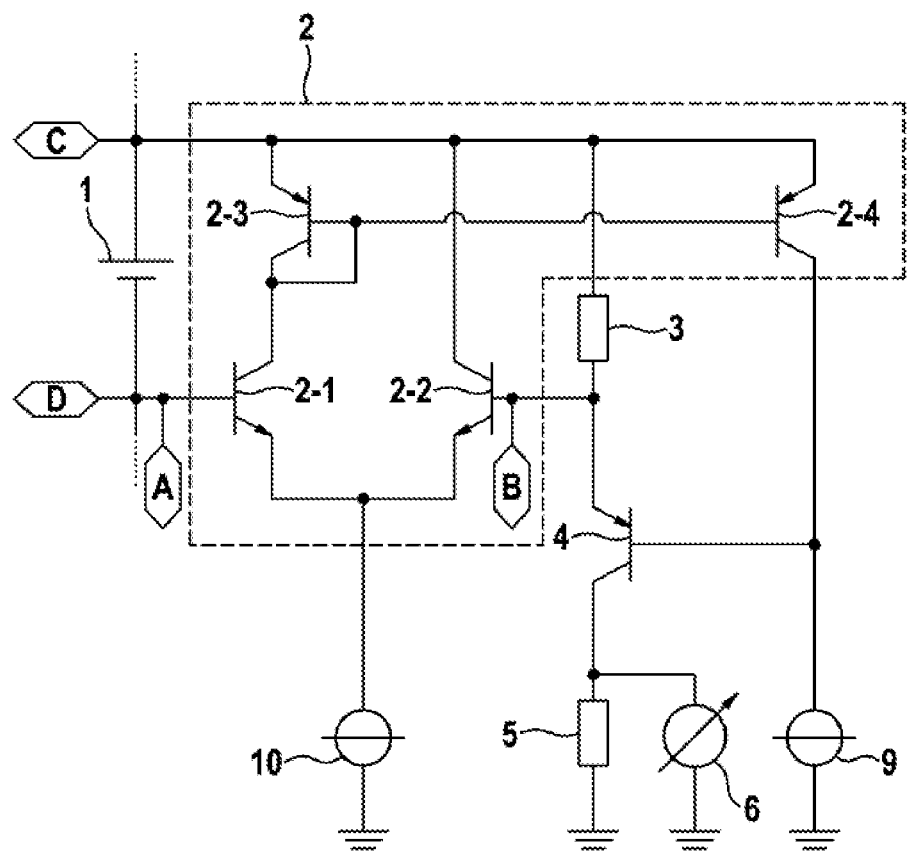
FIG. 2 shows a second exemplary embodiment of a measuring apparatus for use in the context of the disclosure.
Figure 3:
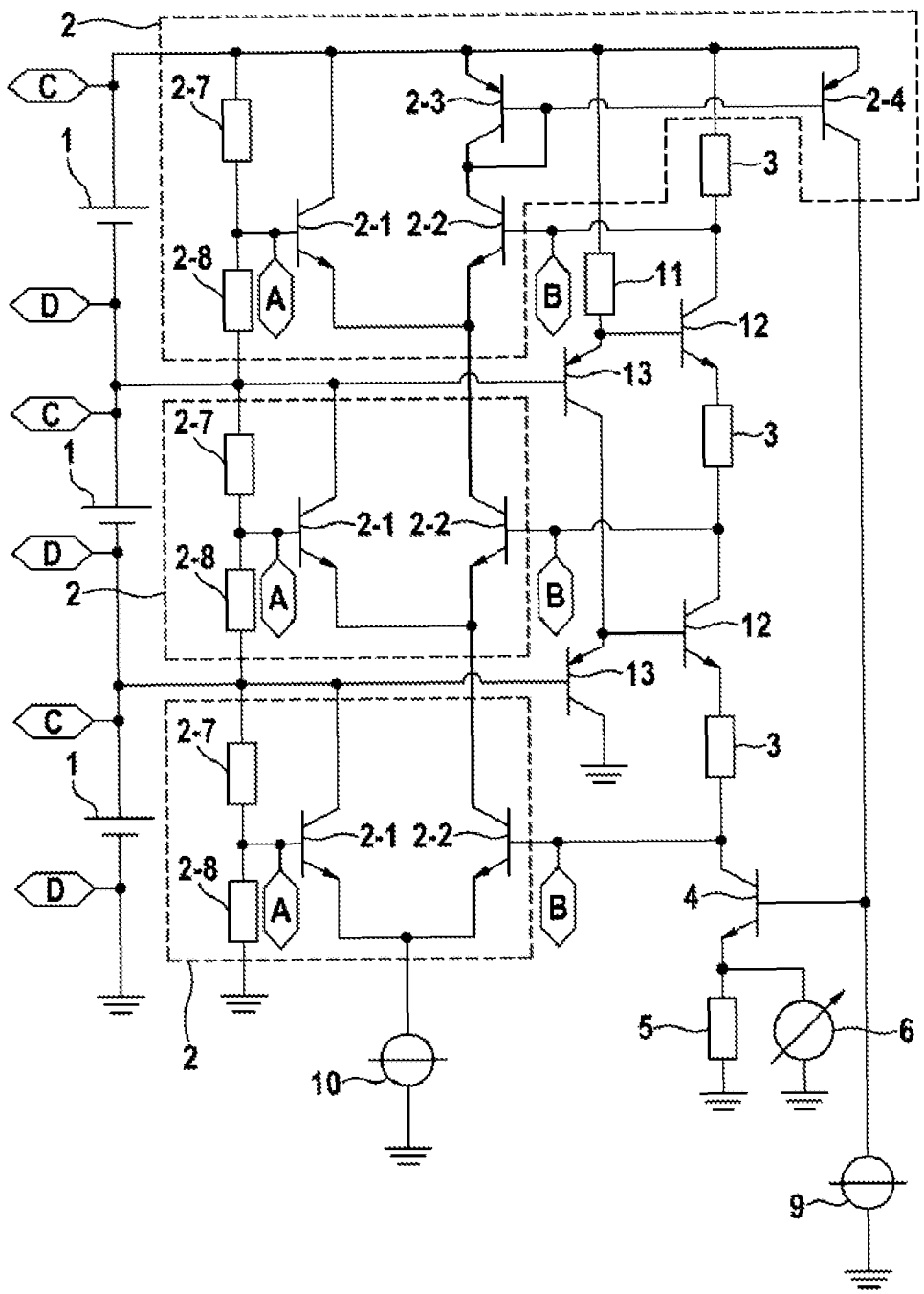
FIG. 3 shows a third exemplary embodiment of a measuring apparatus for use in the context of the disclosure.
Figure 4:
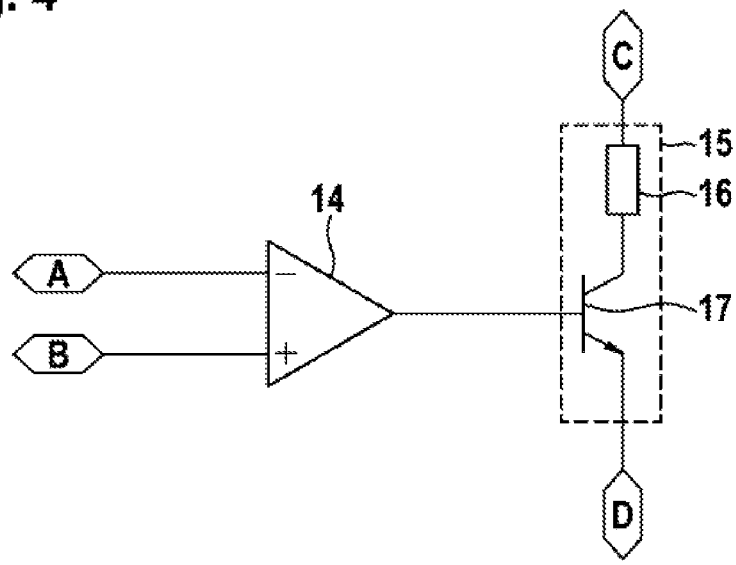
FIG. 4 shows a first exemplary embodiment of a comparator according to the disclosure and of a discharging unit for use in the context of the disclosure.
Figure 5:
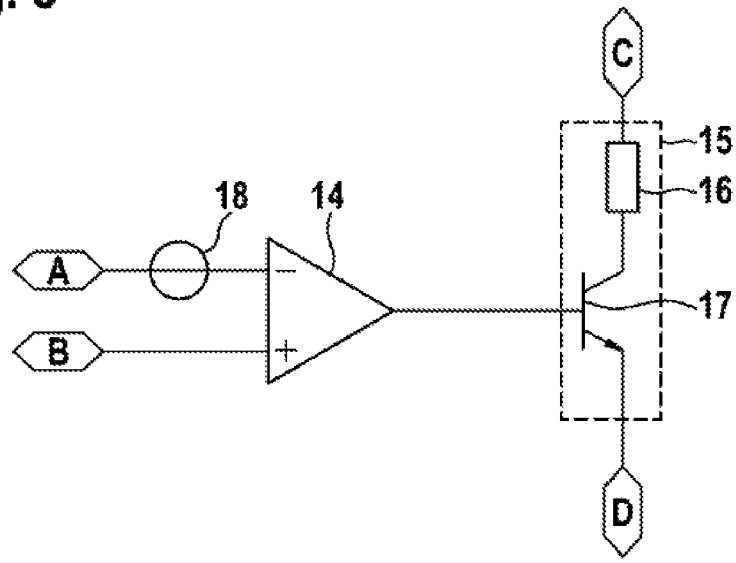
FIG. 5 shows a second exemplary embodiment of a comparator according to the disclosure and of a discharging unit for use in the context of the disclosure.

FIG. 1 shows a first exemplary embodiment of a measuring apparatus for use in the context of the disclosure. FIGS. 1 and 2 serve for elucidating the functioning of a measuring apparatus for use in the context of the disclosure. FIG. 3 shows one possible implementation of a measuring apparatus for use with a plurality of battery cells. In FIGS. 1 to 3, connection points A, B, C and D are marked, to which further circuit elements are to be connected according to the disclosure, said further circuit elements being shown in FIGS. 4 and 5. In FIGS. 4 and 5, the connections that are respectively to be assigned to the connection points A, B, C and D are designated by the use of identical identifications.

A first pole of a battery cell 1, which is connected in series with further battery cells to form a string, is connected to one of two inputs of a transimpedance amplifier 2. The second input of the transimpedance amplifier 2 is connected to one connection of a resistor 3, the further connection of which is in turn connected to a remaining pole of the battery cell 1. The output of the transimpedance amplifier 2 is connected to a control electrode of a current valve 4, which is embodied as an npn transistor in the example shown. However, it is also possible to use other types of transistor or else more complex circuits as the current valve 4. The current valve 4 is connected between that connection of the resistor 3 which is connected to the transimpedance amplifier 2 and the actual voltage measuring apparatus, which is shown only by way of example in all the exemplary embodiments. Said voltage measuring apparatus can comprise a reference resistor 5 having a known resistance value and a voltmeter 6, which measures the voltage dropped across the reference resistor 5.

The transimpedance amplifier 2 compares the cell voltage of the battery cell 1 with the voltage dropped across the resistor 3 and generates an output current, the magnitude of which is proportional to the difference between the two voltages. Said output current passes to the control electrode of the current valve 4, to which an optional desired current source 9 can be connected. Said desired current source 9 carries a constant current and serves for setting the operating point of the current valve 4. The output current of the transimpedance amplifier 2—if appropriate minus the constant current of the desired current source 9—controls the current allowed to pass by the current valve 4. The more current is allowed to pass by the current valve 4, the greater the voltage dropped across the resistor 3 also becomes, however. This has the effect that the voltage at one input of the transimpedance amplifier 2 rises relative to the voltage at the other input thereof, as a result of which the difference between the input voltages decreases and the transimpedance amplifier 2 also correspondingly reduces its output current. However, if too little current flows via the resistor 3, the transimpedance amplifier 2 will accordingly again allow more current to flow to the control electrode of the current valve 4.

This results in a feedback that has the effect that the voltage across the resistor 3 is kept equal to the cell voltage on account of the regulating effect of the regulating cell comprising the transimpedance amplifier 2, the resistor 3 and the current valve 4. Since the inputs of the transimpedance amplifier 2 are ideally embodied with high impedance, the total current flowing through the resistor 3 also flows through the current valve 4 and, on account of the linear relationship between voltage, resistance and current, represents an exact measure of the cell voltage. It could now be measured elsewhere if there is interest in its actual valve, for example by said current being conducted via a reference resistor 5, which itself does not belong to the measuring apparatus, and thereby being converted into a voltage, the magnitude of which results directly from the cell voltage and can be measured in its place independently of the usually high and variable potentials at the battery poles of the battery cell 1 and thus safely. In this case, if appropriate, a correction factor specifying the ratio of the absolute value of the resistor 3 to that of the reference resistor 5 should also be taken into consideration. In order to avoid a corruption of the current output by the current valve 4 by the base current of the current valve 4, embodied as a bipolar transistor in the example shown, it is possible to use for example a MOSFET or an IGBT (Insulated Gate Bipolar Transistor).

FIG. 2 shows a second exemplary embodiment of a measuring apparatus for use in the context of the disclosure, wherein the transimpedance amplifier 2 is embodied as a differential amplifier. The transimpedance amplifier 2 has a connection for a current source 10, which impresses a current into the differential amplifier. Depending on which of the two transistors 2-1 and 2-2 of the two branches of the differential amplifier receives the higher input voltage, the current of the current source 10 will flow through either one transistor or the other. The current flowing through the transistor 2-1 is mirrored and output by means of a current mirror comprising the transistors 2-3 and 2-4. Since the functioning of a differential amplifier is well known in the prior art, it will not be discussed any further here. In contrast to the exemplary embodiment in FIG. 1, the current valve 4 is embodied as a pnp transistor, as a result of which a lower output current of the transimpedance amplifier 2, output by the transistor 2-4, leads to a drop in the voltage at the control electrode of the current valve 4 and, as a result, to an increase in the base-emitter voltage of the current valve, embodied as a pnp transistor. The increased base-emitter voltage in turn brings about a rise in the current through the current valve 4, which as a result again leads to the desired feedback.

However, the current valve 4 could also be embodied as an npn transistor. In this case, the transistor 2-3 could simply be connected into the other branch of the differential amplifier (between the positive pole of the battery cell 1 and the transistor 2-2).

The current source 9 preferably carries a current corresponding to half of the current of the current source 10. In the settled state of the regulating cell, the current of the current source 10 will ideally be divided equally between the two branches of the differential amplifier. In this case, the transistor 2-4 will also output a current corresponding to half of the current of the current source 10, such that the voltage at the control electrode of the current valve 4 remains constant. However, by way of example, a simple resistor or other suitable switching means could also be used instead of the current source 9.

FIG. 3 shows a third exemplary embodiment of a measuring apparatus for use in the context of the disclosure. In the case of this exemplary embodiment, a plurality of regulating cells are constructed and cascaded. The transimpedance amplifiers 2 are once again constructed as differential amplifiers, but the current flowing through one branch of a respective differential amplifier serves as a current source for the differential amplifier placed thereabove. Only the bottommost differential amplifier is connected to a current source 10, which can be constructed for example together with the current source 9 as a current mirror. However, it goes without saying that other forms of realization of the current sources 9 and 10 are also possible.

Apart from the transimpedance amplifiers 2, the resistors 3 are also cascaded. However, since the cascade of transimpedance amplifiers only outputs a single output current, furthermore only one current valve 4 is provided, which can be realized as a transistor or in another of the ways shown.

In order to match the potential above each of the resistors 3 to that of the positive pole of the respectively assigned battery cell 1, without influencing the current flow through the resistors 3, a potential replication device is additionally provided in the lower regulating cells, which potential replication device can comprise a pair of complementary transistors 12 and 13, for example. In order in this case to limit the current through the cascaded transistors 13, in addition a resistor 11 is preferably provided. Instead of the transistors 12 and 13 and the resistor 11, however, it is also possible to provide other circuits that match the potential at the resistors 3 to that at the positive poles of the battery cells 1.

That input of the differential amplifiers which is connected to the battery cells 1 can have a voltage divider formed from resistors 2-7 and 2-8, since otherwise a sufficiently high potential would no longer be available for the topmost differential amplifier at the collectors and respectively for the bottommost differential amplifier at the emitters of the transistors 2-1 and 2-2.

The measuring apparatus from FIG. 3 has the particular property that the cell voltages of a plurality of battery cells 1 can be measured simultaneously, but only the minimum cell voltage of all the battery cells 1 is measured. That is to say that the current output by the cascade of differential amplifiers in the exemplary embodiment of FIG. 3 is proportional to the smallest of all the cell voltages. In this case, the measuring apparatus in FIG. 3 can, of course, also be implemented for only two battery cells 1 or a larger number of battery cells.

According to the disclosure, the minimum cell voltage of all the battery cells 1 is determined in order to be able to compare the cell voltages of the further battery cells with the minimum cell voltage and, in the case of a sufficiently large deviation, to reduce the cell voltages of the further battery cells in a targeted manner. By means of this cell balancing, the charge states of all the battery cells are matched to one another, which has a positive effect on the lifetime of the battery. By virtue of the fact that the disclosure provides a simple means for determining the minimum cell voltage and means for comparing the voltage and for discharging the battery cells, an apparatus for cell balancing can be realized which can operate fully autonomously within the battery and without inclusion of complex components such as microcontrollers and the like.

FIG. 4 shows a first exemplary embodiment of a comparator according to the disclosure and of a discharging unit for use in the context of the disclosure. The comparator 14 is preferably embodied as a customary differential amplifier which generates an output voltage that is proportional to a voltage difference existing between its two inputs. On account of the high gain of the differential amplifier, small voltage differences already lead to a saturation of the output voltage of the differential amplifier, such that said output voltage can be regarded as a binary control signal. Said control signal is output to a control input of a discharging unit 15, which, depending on the logic level of the control signal, discharges a battery cell connected to the discharging unit 15 or else prevents a current flow between the connection points C and D through the discharging unit 15. The discharging unit 15 preferably comprises a switching transistor 17, which can be embodied for example as a bipolar transistor or as a field effect transistor. In this case, the switching transistor 17 is switched directly by the control signal generated by the comparator 14. In order to limit the current flow through the discharging unit 15 in the case of discharging the battery cell, a limiting resistor 16 is preferably provided.

FIG. 5 shows a second exemplary embodiment of a comparator according to the disclosure and of a discharging unit for use in the context of the disclosure. The second exemplary embodiment differs from the first exemplary embodiment in that one of the inputs of the comparator 14 is connected to the assigned connection point via a voltage source 18. The voltage source 18 generates a differential voltage that alters the voltage at the input of the comparator 14. As a result, the comparator 14 will generate the logic level of the control signal in a manner taking account of the offset voltage. This has the effect that a battery cell connected to the comparator 14 and the discharging unit 15 is discharged only when the cell voltage of the battery cell is greater than the minimum cell voltage by at least the offset voltage, as a result of which it is possible to avoid faulty discharging as a result of disturbing effects such as noise, sudden load changes or other dynamic influences.

The invention claimed is:

1. A circuit for measuring battery cell voltage in a plurality of battery cells connected in series comprising:
 a first transimpedance amplifier and a first resistor, the first transimpedance amplifier having a first input configured to be connected to a first pole of one battery cell in the plurality of battery cells and a second input connected to the first resistor, the first resistor being further configured to be connected to a second pole of the battery;
 a cascade configuration of a plurality of transimpedance amplifiers connected to the first transimepdance amplifier and the first resistor, a plurality of potential replication devices, and a plurality of resistors connected to the first transimpedance amplifier, the cascade configuration further comprising:
  a first input in each transimpedance amplifier configured to be connected to a first pole of one battery cell in the plurality of battery cells and a second input connected to an output of one potential replication device in the plurality of potential replication devices;
  each potential replication device including a first input configured to receive a first voltage from the first pole of one battery cell in the plurality of battery cells, a second input configured to receive a second voltage from a subsequent potential replication device in the plurality of replication devices, and an output configured to generate a voltage signal that is substantially equal to the second voltage; and
  each resistor in the plurality of resistors being connected between an output of one potential replication device in the plurality of potential replication devices and a second input of one transimpedance amplifier in the plurality of transimpedance amplifiers;
 a first constant current source connected to an output of the first transimpedance amplifier;
 a second constant current source connected to a supply voltage input in a final transimpedance amplifier in the plurality of transimpedance amplifiers in the cascade configuration; and
 a measuring circuit connected to one resistor in the plurality of resistors that is connected to the second input of the final transimpedance amplifier in the plurality of transimpedance amplifiers in the cascade configuration, the measuring circuit comprising:
  a reference resistor;
  a transistor with a collector connected to the one resistor in the plurality of resistors, an emitter connected to the reference resistor, and a base connected to an output of the comparator; and
  a voltmeter connected to the reference resistor, the voltmeter generating a voltage measurement across the reference resistor that corresponds to a minimum voltage level of any battery cell in the plurality of battery cells that the plurality of potential replication devices produce through the one resistor in the plurality of resistors at the input of the measuring circuit.

2. The circuit of claim 1, each potential replication device in the plurality of potential replication devices further comprising:
 a pnp transistor and an npn transistor, a base of the pnp transistor being the first input of the potential replication device, a collector of the pnp transistor being the second input of the potential replication device, an emitter of the pnp transistor being connected to a base of the npn transistor, and an emitter of the npn transistor being the output of the potential replication device.

3. The circuit of claim 1 further comprising:
 a plurality of discharging units, each discharging unit comprising:
  a comparator having a first input and a second input connected to a corresponding first input and second input of one of the plurality of transimpedance amplifiers;
  a discharge transistor and current limiting resistor configured to be connected in parallel to the first pole and the second pole of the battery cell in the plurality of battery cells connected to the transimpedance amplifier in the plurality of transimpedance amplifiers connected to the first input and the second input of the comparator, a base of the discharge transistor being connected to an output of the comparator; and
  the comparator being configured to:
   generate a first output signal to switch on the discharge transistor in response to a voltage level present at the first input of the comparator being greater than a voltage level present at the second input of the comparator; and
   generate a second output signal to switch off the discharge transistor in response to a voltage level present at the first input of the comparator being less than a voltage level present at the second input of the comparator.

4. A battery comprising:
 a plurality of battery cells connected in series; and
 a circuit for measuring a minimum voltage in the plurality of battery cells comprising:
 a first transimpedance amplifier and a first resistor, the first transimpedance amplifier having a first input configured to be connected to a first pole of one battery cell in the plurality of battery cells and a second input connected to the first resistor, the first resistor being further configured to be connected to a second pole of the battery;
 a cascade configuration of a plurality of transimpedance amplifiers connected to the first transimepdance amplifier and the first resistor, a plurality of potential replication devices, and a plurality of resistors connected to the first transimpedance amplifier, the cascade configuration further comprising:
- a first input in each transimpedance amplifier configured to be connected to a first pole of one battery cell in the plurality of battery cells and a second input connected to an output of one potential replication device in the plurality of potential replication devices;
- each potential replication device including a first input configured to receive a first voltage from the first pole of one battery cell in the plurality of battery cells, a second input configured to receive a second voltage from a subsequent potential replication device in the plurality of replication devices, and an output configured to generate a voltage signal that is substantially equal to the second voltage; and
- each resistor in the plurality of resistors being connected between an output of one potential replication device in the plurality of potential replication devices and a second input of one transimpedance amplifier in the plurality of transimpedance amplifiers;
- a first constant current source connected to an output of the first transimpedance amplifier;
- a second constant current source connected to a supply voltage input in a final transimpedance amplifier in the plurality of transimpedance amplifiers in the cascade configuration; and
- a measuring circuit connected to one resistor in the plurality of resistors that is connected to the second input of the final transimpedance amplifier in the plurality of transimpedance amplifiers in the cascade configuration, the measuring circuit comprising:
  - a reference resistor;
  - a transistor with a collector connected to the one resistor in the plurality of resistors, an emitter connected to the reference resistor, and a base connected to an output of the comparator; and
  - a voltmeter connected to the reference resistor, the voltmeter generating a voltage measurement across the reference resistor that corresponds to a minimum voltage level of any battery cell in the plurality of battery cells that the plurality of potential replication devices produce through the one resistor in the plurality of resistors at the input of the measuring circuit.

5. A motor vehicle comprising:
an electric drive motor configured to drive the motor vehicle;
a plurality of battery cells connected in series and connected to the electric drive motor; and
a circuit for measuring a minimum voltage in the plurality of battery cells comprising:
- a first transimpedance amplifier and a first resistor, the first transimpedance amplifier having a first input configured to be connected to a first pole of one battery cell in the plurality of battery cells and a second input connected to the first resistor, the first resistor being further configured to be connected to a second pole of the battery;
- a cascade configuration of a plurality of transimpedance amplifiers connected to the first transimepdance amplifier and the first resistor, a plurality of potential replication devices, and a plurality of resistors connected to the first transimpedance amplifier, the cascade configuration further comprising:
  - a first input in each transimpedance amplifier configured to be connected to a first pole of one battery cell in the plurality of battery cells and a second input connected to an output of one potential replication device in the plurality of potential replication devices;
  - each potential replication device including a first input configured to receive a first voltage from the first pole of one battery cell in the plurality of battery cells, a second input configured to receive a second voltage from a subsequent potential replication device in the plurality of replication devices, and an output configured to generate a voltage signal that is substantially equal to the second voltage; and
  - each resistor in the plurality of resistors being connected between an output of one potential replication device in the plurality of potential replication devices and a second input of one transimpedance amplifier in the plurality of transimpedance amplifiers;
- a first constant current source connected to an output of the first transimpedance amplifier;
- a second constant current source connected to a supply voltage input in a final transimpedance amplifier in the plurality of transimpedance amplifiers in the cascade configuration; and
- a measuring circuit connected to one resistor in the plurality of resistors that is connected to the second input of the final transimpedance amplifier in the plurality of transimpedance amplifiers in the cascade configuration, the measuring circuit comprising:
  - a reference resistor;
  - a transistor with a collector connected to the one resistor in the plurality of resistors, an emitter connected to the reference resistor, and a base connected to an output of the comparator; and
  - a voltmeter connected to the reference resistor, the voltmeter generating a voltage measurement across the reference resistor that corresponds to a minimum voltage level of any battery cell in the plurality of battery cells that the plurality of potential replication devices produce through the one resistor in the plurality of resistors at the input of the measuring circuit.

* * * * *